(12) United States Patent
Bonser et al.

(10) Patent No.: US 7,091,106 B2
(45) Date of Patent: Aug. 15, 2006

(54) METHOD OF REDUCING STI DIVOT FORMATION DURING SEMICONDUCTOR DEVICE FABRICATION

(75) Inventors: Douglas J. Bonser, Hopewell Junction, NY (US); Johannes F. Groschopf, Fishkill, NY (US); Srikanteswara Dakshina-Murthy, Wappingers Falls, NY (US); John G. Pellerin, Hopewell Jct, NY (US); Jon D. Cheek, Wallkill, NY (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 109 days.

(21) Appl. No.: 10/791,759

(22) Filed: Mar. 4, 2004

(65) Prior Publication Data

US 2005/0196928 A1    Sep. 8, 2005

(51) Int. Cl.
*H01L 21/76* (2006.01)

(52) U.S. Cl. ............................. 438/424; 257/E21.545; 257/E21.564

(58) Field of Classification Search ................. 438/424
See application file for complete search history.

(56) References Cited

U.S. PATENT DOCUMENTS

| | | | |
|---|---|---|---|
| 5,177,028 A | | 1/1993 | Manning |
| 5,665,633 A | * | 9/1997 | Meyer ......................... 438/427 |
| 6,248,641 B1 | * | 6/2001 | Liu et al. ..................... 438/400 |
| 6,555,476 B1 | | 4/2003 | Olsen et al. |
| 6,599,810 B1 | * | 7/2003 | Kepler et al. ................ 438/424 |
| 6,673,695 B1 | | 1/2004 | Lim et al. |
| 2002/0098661 A1 | | 7/2002 | Cha et al. |

* cited by examiner

*Primary Examiner*—David Nelms
*Assistant Examiner*—Long Tran (57) ABSTRACT

STI divot formation is eliminated or substantially reduced by employing a very thin nitride polish stop layer, e.g., no thicker than 400 Å. The very thin nitride polish stop layer is retained in place during subsequent masking, implanting and cleaning steps to form dopant regions, and is removed prior to gate oxide and gate electrode formation.

7 Claims, 11 Drawing Sheets

METHOD OF REDUCING STI DIVOT FORMATION DURING SEMICONDUCTOR DEVICE FABRICATION

FIELD OF THE INVENTION

The present invention relates to the fabrication of integrated circuit semiconductor devices. The present invention is particularly applicable to fabricating highly integrated circuit semiconductor devices having high quality shallow trench isolation (STI) without or with substantially reduced divot formation.

BACKGROUND ART

As miniaturization of elements of an integrated circuit semiconductor device drives the industry, the width and the pitch of an active region have become smaller, thereby rendering the use of traditional LOCOS (local oxidation of silicon) isolation techniques problematic. STI is considered a more viable isolation technique than LOCOS because, by its nature, creates hardly any bird's beak characteristic of LOCOS, thereby achieving reduced conversion differences.

Conventional STI fabrication techniques include forming a pad oxide on an upper surface of a semiconductor substrate, forming a nitride, e.g., silicon nitride, polish stop layer thereon, typically having a thickness of greater than 1000 Å, forming an opening in the nitride polish stop layer, anisotropically etching to form a trench in the semiconductor substrate, forming a thermal oxide liner in the trench and then filling the trench with insulating material, such as silicon oxide, forming an overburden on the nitride polish stop layer. Planarization is then implemented, as by conducting chemical mechanical polishing (CMP). During subsequent processing, the nitride layer is removed along with the pad oxide followed by formation of active areas, which typically involve masking, ion implantation, and cleaning steps. During such cleaning steps, the top corners of the field oxide are isotropically removed leaving a void or "divot" in the oxide fill.

For example, a conventional STI fabrication technique is illustrated in FIGS. 1 through 4, wherein similar features are denoted by similar reference characters. Adverting to FIG. 1, a pad oxide 11 is formed over an upper surface of a semiconductor substrate 10, and a silicon nitride polish stop layer 12 is formed thereon, typically at a thickness in excess of 1000 Å. A photomask (not shown) is then used to form an opening through the nitride polish stop layer 12, pad oxide 11, and a trench 12 is formed in the semiconductor substrate 10.

Figure 1:
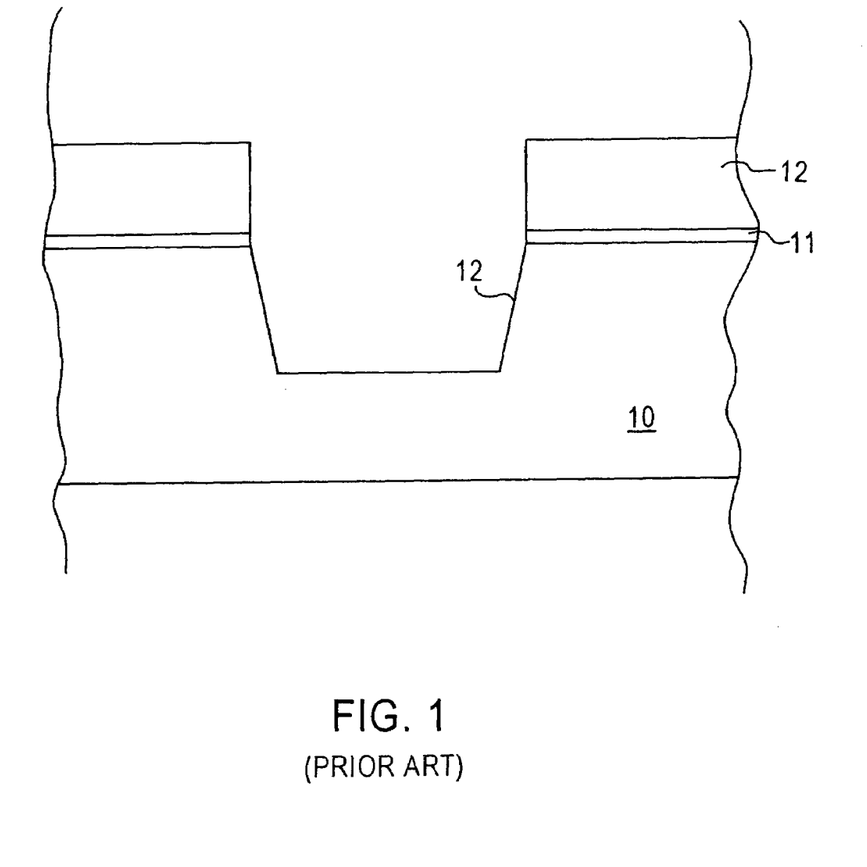
FIGS. 1 through 4 schematically illustrate sequential phases of a conventional method for forming STI regions.
Figure 2:
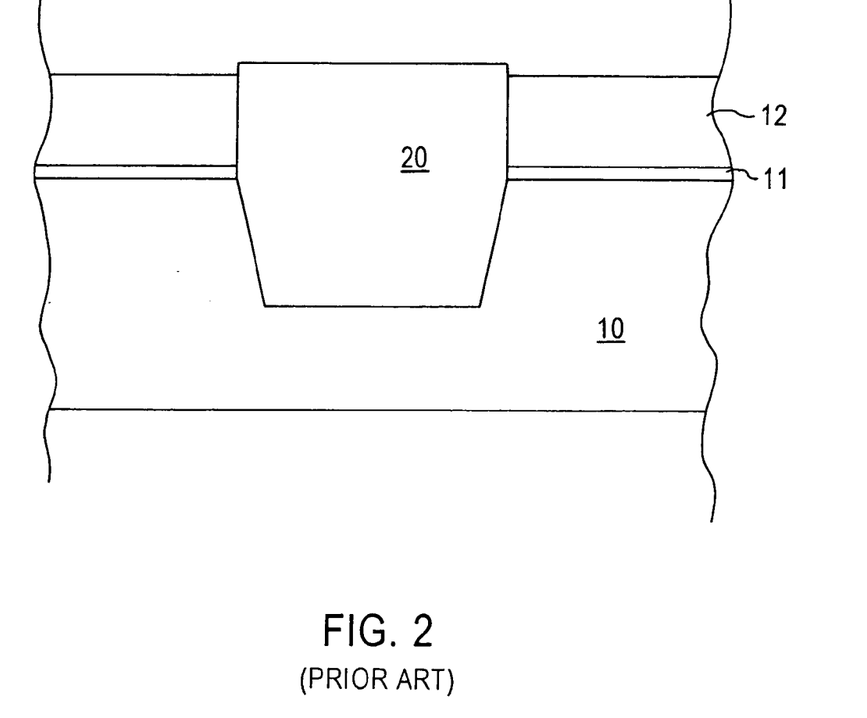
Figure 3:
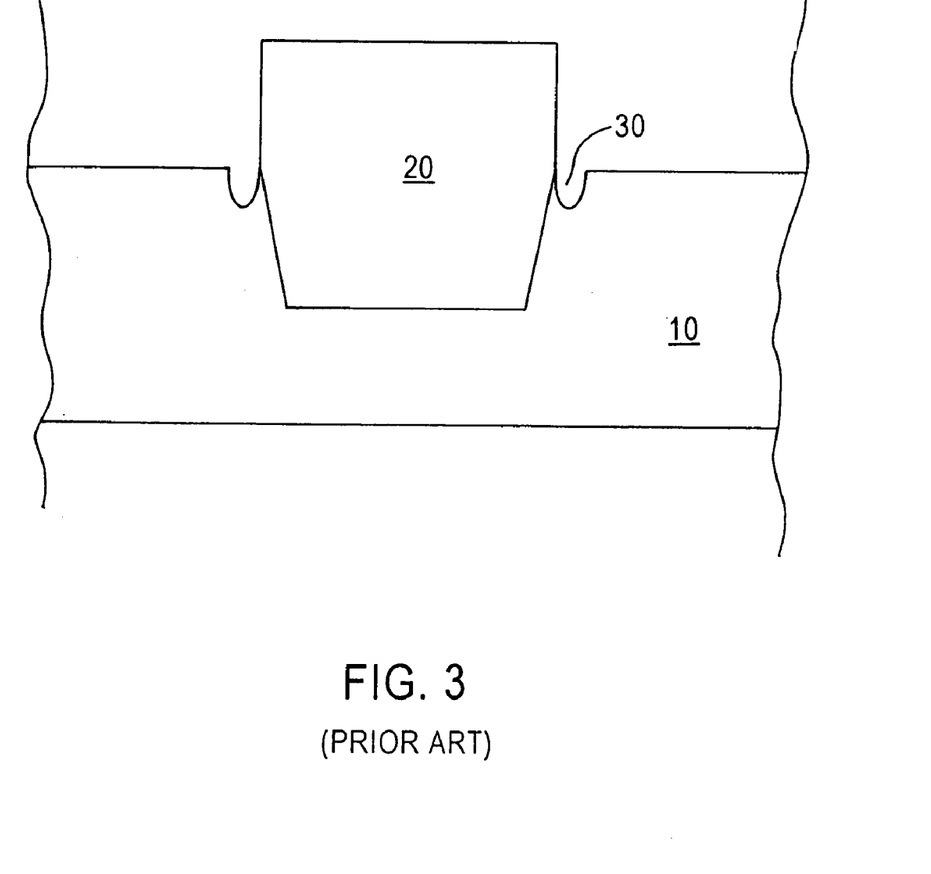

Subsequently, a thermal oxide liner (not shown) is formed in the trench, an insulating material is deposited and planarization implemented, as by CMP, resulting in the intermediate structure illustrated in FIG. 2, the reference character 20 denoting the oxide fill. Subsequently, the nitride polish stop layer 12 and pad oxide layer 11 are removed and cleaning steps are performed prior to forming active regions. Such cleaning steps result in the formation of divots 30 as illustrated in FIG. 3.

Figure 4:
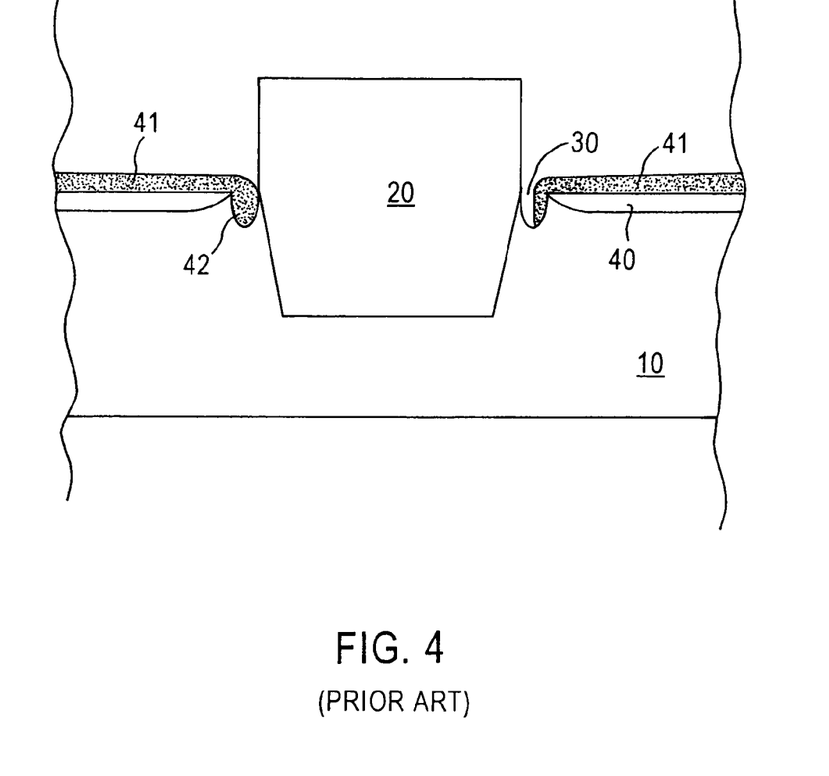
Figure 5:
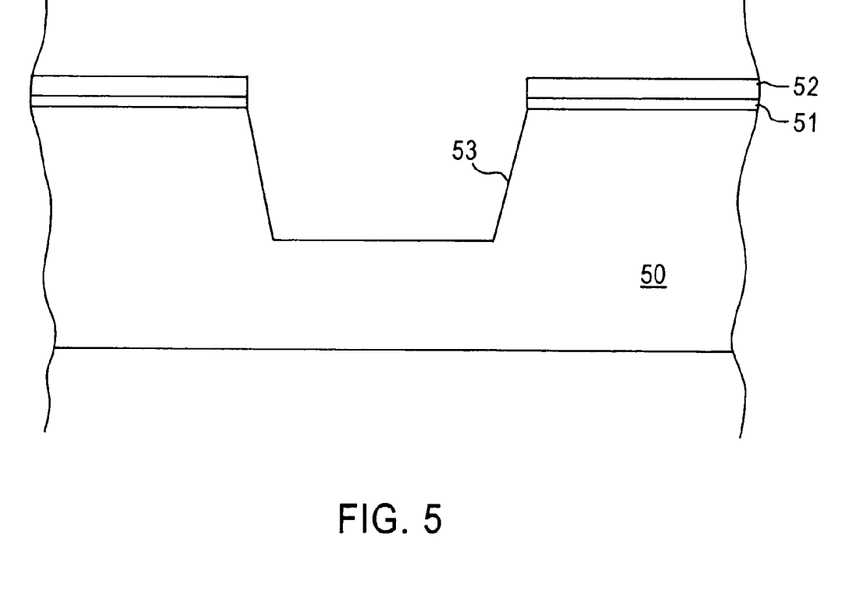
FIGS. 5 through 11 schematically illustrate sequential phases of a method in accordance with an embodiment of the present invention.

The STI divots are problematic in various respects. For example, STI divots are responsible for high field edge leakage, particularly with shallow source/drain junctions. As shown in FIG. 4, silicide regions 41 formed on shallow source/drain regions 40 grow steeply downwards, as illustrated by reference character 42, below the junction depth formed at a latter stage resulting in high leakage and shorting. Segregation of dopants, notably boron, at STI field edges reduces the junction depth. Accordingly, after the junctions are silicided, the silicide 42 penetrating to the substrate causes shorting routes and, hence, large leakage occurrence from the source/drain junctions to a well or substrate.

In addition, if the STI edge becomes exposed as a result of divot formation, a parasitic transistor with a low threshold voltage is formed over the area with low impurity concentration causing a kink in the characteristics curve of a transistor. The presence of a kink results in electrical characteristics different from the design electrical characteristics, thereby preventing the fabrication of transistors with uniform characteristics.

Accordingly, there exists a need for methodology enabling the fabrication of highly integrated semiconductor devices with highly reliable STI regions without or with substantially reduced divots.

DISCLOSURE OF THE INVENTION

An advantage of the present invention is a method of manufacturing a semiconductor device comprising highly reliable STI regions with no or substantially reduced divots.

Additional advantages and other features of the present invention will be set forth in the description which follows and in part will be apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising: forming a nitride polish stop layer, at a thickness no greater than 400 Å, over a semiconductor substrate; forming an opening in the nitride polish stop layer and a trench in the substrate; filling the opening with insulating material forming an overburden on the nitride polish stop layer; and polishing to form an upper planar surface stopping on the nitride polish stop layer, thereby forming a shallow trench isolation region.

Embodiments of the present invention comprise forming a pad oxide on an upper surface of the semiconductor device substrate, forming the nitride polish stop layer, e.g., a silicon nitride polish stop layer, at a thickness of 50 Å to 150 Å, e.g., 100 Å, on the pad oxide layer, filling the opening with dielectric insulating material, such as silicon oxide deposited by chemical vapor deposition, and then implementing chemical mechanical polishing (CMP) to effect planarization stopping on the nitride polish stop layer by removing no more than 20 Å of the upper surface of the nitride polish stop layer. Embodiments of the present invention further include ion planting impurities through the nitride polish stop layer to form impurity regions in the semiconductor substrate adjacent the shallow trench isolation region, etching to remove part of the upper surface of the insulating material filling the trench so that the upper surface of the insulating material in the trench is substantially coplanar with the upper surface of the semiconductor substrate, and then removing the nitride polish stop layer. Subsequently, a gate oxide layer is formed on the substrate and a gate electrode layer is formed thereon, employing conventional techniques.

Additional advantages of the present invention will become readily apparent to those skilled in the art from the following detailed description, wherein embodiments of the present invention are described, simply by way of illustration of the best mode contemplated for carrying out the present invention. As will be realized, the present invention is capable of other and different embodiments and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

In FIGS. 1 through 4, similar features are denoted by similar reference characters.

In FIGS. 5 through 11, similar features are denoted by similar reference characters.

DESCRIPTION OF THE INVENTION

The present invention addresses and solves problems attendant upon implementing conventional STI methodology resulting in the formation of divots at the corners of an STI region. Such conventional methodology typically comprises forming a relatively thick nitride polish stop layer, as at a thickness greater than 1000 Å. Such a thick nitride polish stop layer is typically removed immediately following the STI oxide polish, because subsequent steps require ion implanting to form the active areas, and thick nitride films block such ion implantation. Many masking, implanting and cleaning steps are used to form the active regions resulting in the formation of divots at the corners of the STI region. Conventional approaches to this problem seek to minimize these divots as, for example, by optimizing post oxide polish cleans and nitride pull-back prior to STI oxide fill. However, such approaches have not adequately resolved the STI divot problem.

In accordance with the present invention, an extremely thin nitride polish stop layer, e.g., silicon nitride, is deposited at a thickness no greater than 400 Å, such as at a thickness of 10 Å to 400 Å. Suitable silicon nitride polish etch stop layer thicknesses are 50 Å to 150 Å, e.g., 100 Å.

Advantageously, the thin nitride polish stop layer is not removed immediately after the STI oxide polish. Rather, the thin nitride etch stop layer is retained during subsequent processing comprising masking, ion implanting and cleaning steps to form the active areas. The use of a thin nitride etch stop layer is sufficient to protect the filled trench corners, thereby preventing isotropic attack of the oxide at the STI corners, which would otherwise result in the formation of divots. In addition, since the nitride polish stop layer is thin, ion implantation is not blocked. In fact, the use of a thin nitride polish stop layer presents a more consistent surface for implantation, because a relatively bare silicon surface rapidly forms an inconsistent native oxide; whereas, the nitride surface is considerably more stable. Thus, in accordance with the embodiments of the present invention, the nitride polish stop layer is retained in place up to the formation of the gate oxide, thereby protecting the active silicon area, providing a much more planar surface and preventing or substantially reducing divots.

A method in accordance with an embodiment of the present invention is schematically illustrated in FIGS. 5 through 11, wherein similar features are denoted by similar reference characters. Adverting to FIG. 5, a pad oxide, as at a thickness of 50 Å to 200 Å, e.g., 150 Å, is formed over an upper surface of semiconductor substrate 50. In accordance with embodiments of the present invention, a very thin silicon nitride etch stop layer 52 is formed on pad oxide 51. Silicon nitride etch stop layer 52 is typically formed at a thickness of 50 Å to 150 Å, e.g., 100 Å. A trench 53 is then formed in the substrate 50, as by employing conventional photolithographic and etching techniques.

Figure 6:
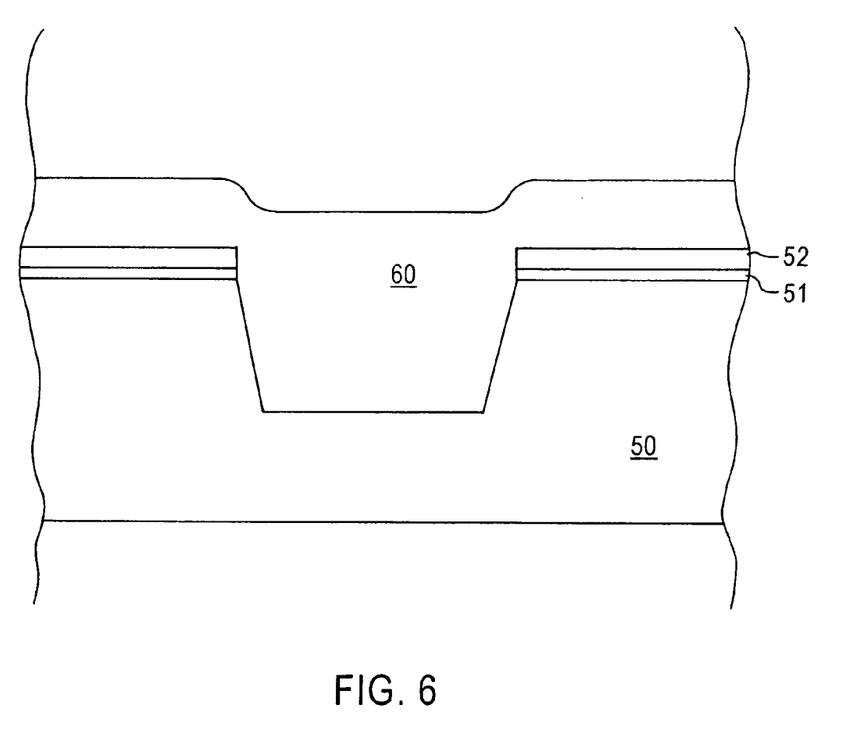
Figure 7:
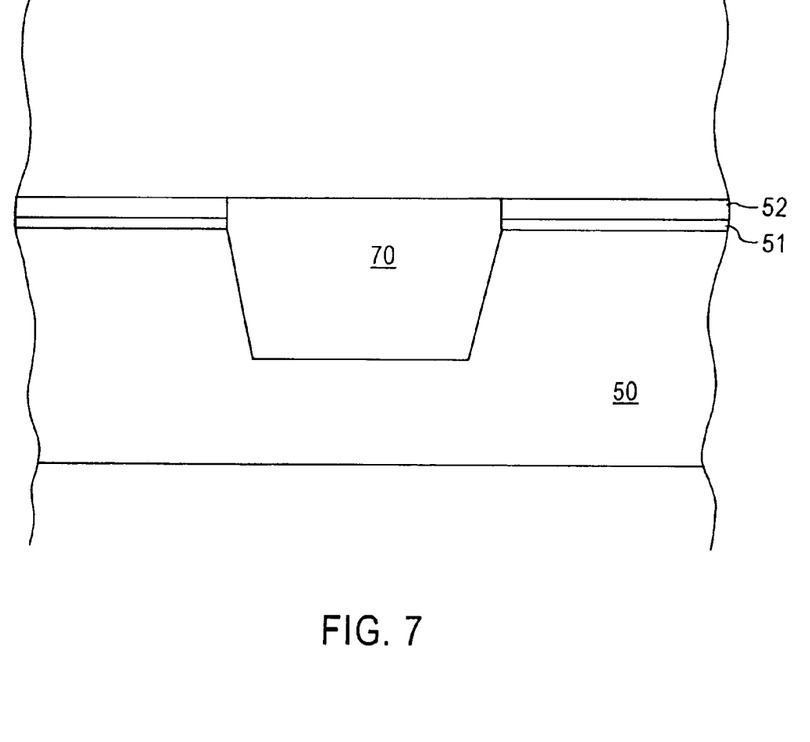

At this point, although not illustrated, a thin thermal oxide may be formed lining the trench. Subsequently, as shown in FIG. 6, an insulating material 60, such as silicon oxide, is deposited to fill the trench and form an overburden on the silicon nitride polish stop layer 52, as by CVD. Planarization is then implemented, as by CMP, resulting in the intermediate structure illustrated in FIG. 7, wherein reference character 70 denotes the STI oxide fill. CMP is typically conducted such that when stopping on the silicon nitride polish stop layer 52, no more than 20 Å is removed from the upper surface of silicon nitride polish stop layer 52.

Figure 8:
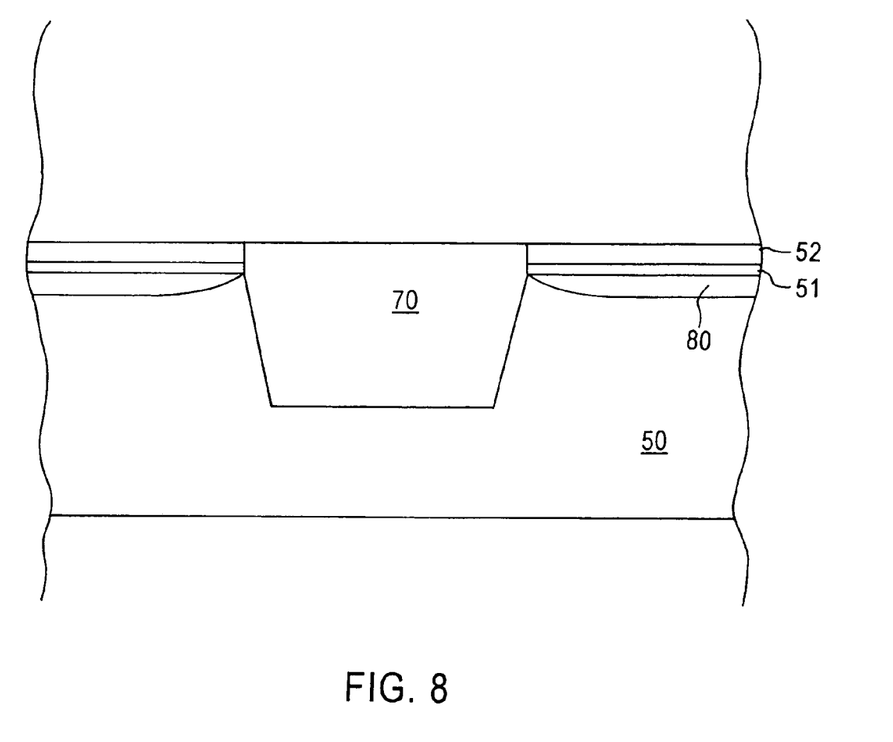

In conventional practices, the silicon nitride polish stop layer is removed after CMP followed by conventional masking, ion implanting and cleaning steps to form the active regions, resulting in the formation of divots. However, in accordance with embodiments of the present invention, the relatively thin silicon nitride polish stop layer 52 is retained during subsequent masking, ion implanting and cleaning steps, which are implemented in a conventional manner, resulting in the formation of impurity regions 80, as shown in FIG. 8, which may ultimately be used for source/drain regions of transistors. As silicon nitride polish stop layer 52 is relatively thin, there is virtually little blocking of the ions during implantation. In addition, the silicon nitride layer forms a stable surface enabling greater uniformity in the formation of the impurity regions.

Figure 9:
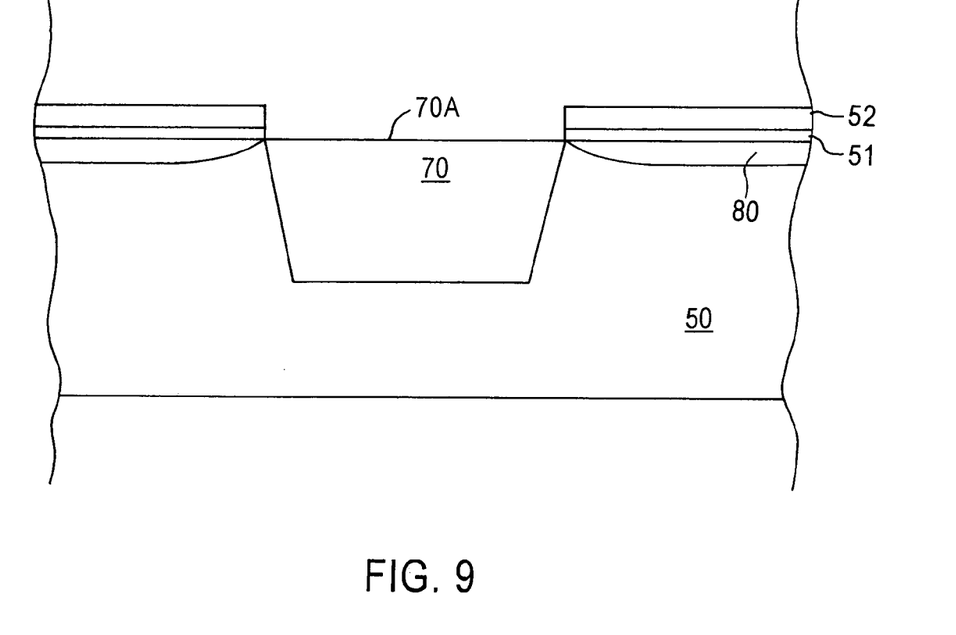
Figure 10:
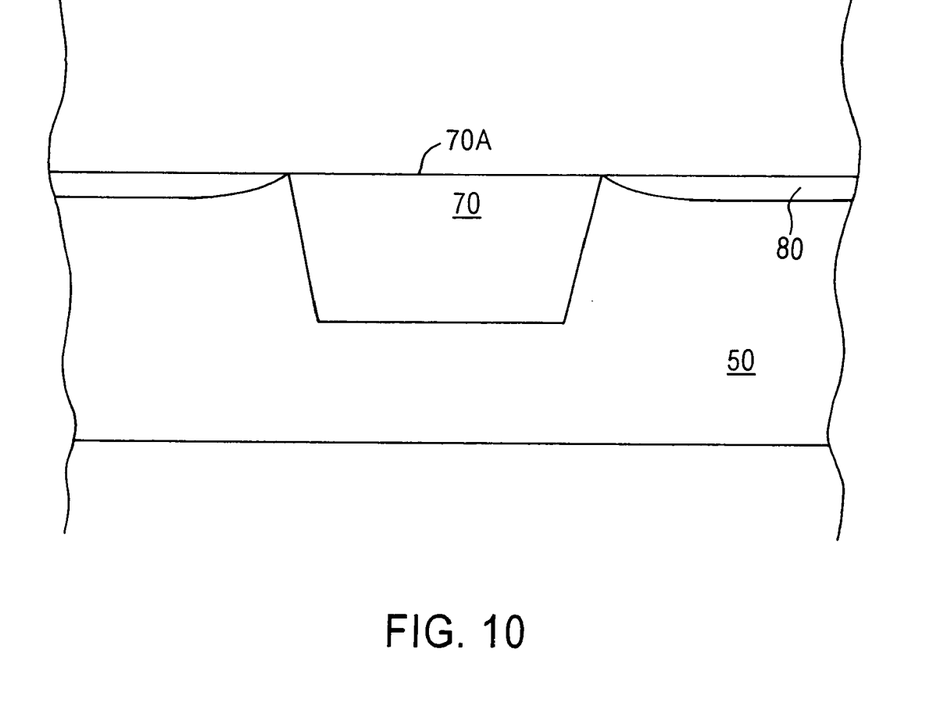
Figure 11:
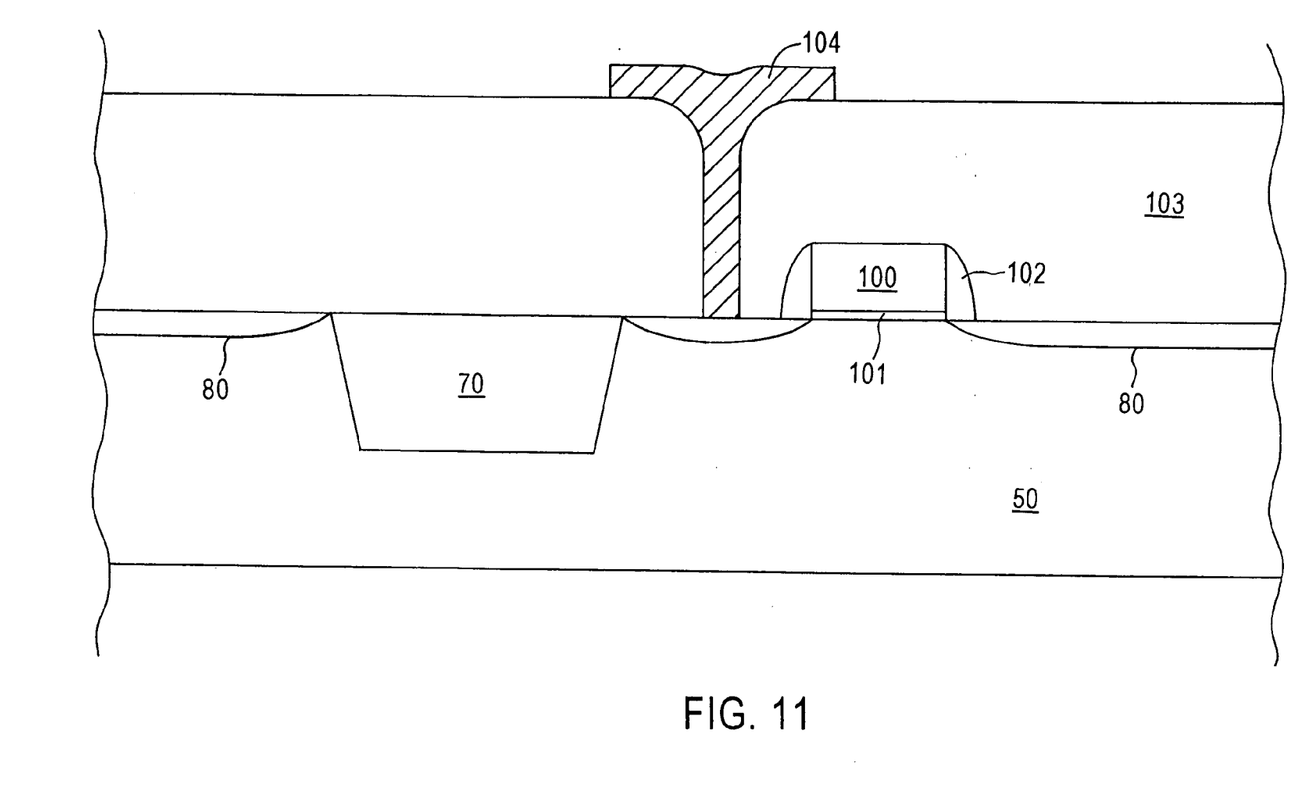

Subsequently, the upper surface of the STI oxide fill 70 is removed, as by employing hydrofluoric acid, such that the upper surface 70A is substantially coplanar with the upper surface of semiconductor substrate 50, resulting in the intermediate structure illustrated in FIG. 9. Subsequently, the silicon nitride polish stop layer 52 is removed, as by employing hydrofluoric acid, and the pad oxide layer 51 is then removed, resulting in the structure illustrated in FIG. 10. Subsequent processing is implemented to form a transistor structure as illustrated in FIG. 11, comprising gate electrode 100 overlying semiconductor substrate 50 with gate oxide 101 therebetween, and dielectric sidewall spaces 102 thereon. In FIG. 11 reference 103 represents an interlayer dielectric and element 50 represents an electric contact through the dielectric layer to an active region 80 on substrate 50.

The present invention provides methodology enabling the fabrication of semiconductor devices with highly reliable STI regions without or with substantially reduced divot formation. Embodiments of the present invention comprise strategically reducing the thickness of a silicon nitride polish stop layer to below 400 Å and retaining the silicon nitride polish stop layer immediately after CMP to protect the trench corners from isotropic etching during conventional cleaning steps implemented when forming active regions and by retaining the thin silicon nitride polish stop layer during ion implantation, thereby achieving highly uniform implanted regions.

The present invention enjoys industrial applicability in fabricating highly integrated semiconductor devices containing STI regions with no or substantially reduced divot formation. The present invention enjoys particular applicability in manufacturing semiconductor devices with submicron dimensions.

In the preceding description, the present invention is described with reference to specifically exemplary embodiments thereof. It will, however, be evident that various modifications and changes may be made thereto without departing from the broader spirit and scope of the present invention, as set forth in the claims. The specification and drawings are, accordingly, to be regarded as illustrative and not as restrictive. It is understood that the present invention is capable of using various other combinations and embodiments and is capable of any changes or modifications within the scope of the inventive concept as expressed herein.

What is claimed is:

1. A method of fabricating a semiconductor device, the method comprising:
    forming a nitride polish stop layer, at a thickness no greater than 400 Å, over a semiconductor substrate;
    forming an opening in the nitride polish stop layer and a trench in the substrate;
    filling the trench with insulating material forming an overburden on the nitride polish stop layer;
    polishing to form an upper planar surface stopping on the nitride polish stop layer, thereby forming a shallow trench isolation region; and
    ion implanting impurities through the nitride polish stop layer to form impurity regions for source/drain regions in the semiconductor substrate adjacent the shallow trench isolation region.

2. The method according to claim 1, comprising forming the nitride polish stop layer at a thickness of 50 Å to 150 Å.

3. The method according to claim 1, comprising polishing to form the upper planar surface while removing no more than 20 Å of the nitride polish stop layer.

4. The method according to claim 1, comprising forming a pad oxide layer on an upper surface of the semiconductor substrate, and forming the nitride polish stop layer on the pad oxide layer.

5. The method according to claim 1, further comprising:
    removing the nitride polish stop layer;
    forming a gate oxide layer on the semiconductor substrate after removing the nitride polish stop layer; and
    forming a gate electrode on the gate oxide layer.

6. The method according to claim 5, further comprising etching to remove part of an upper surface of the insulating material filling the trench so that the upper surface of the insulating material is substantially coplanar with the upper surface of the semiconductor substrate before removing the nitride polish stop layer.

7. A method of fabricating a semiconductor device, the method comprising:
    forming a nitride polish stop layer, at a thickness no greater than 400 Å, over a semiconductor substrate;
    forming an opening in the nitride polish stop layer and a trench in the substrate;
    filling the trench with insulating material forming an overburden on the nitride polish stop layer;
    polishing to form an upper planar surface stopping on the nitride polish stop layer, thereby forming a shallow trench isolation region; subsequently
    etching to remove part of an upper surface of the insulating material filling the trench so that the upper surface of the insulating material is substantially coplanar with the upper surface of the semiconductor substrate; and, subsequently,
    removing the nitride polish stop layer.

* * * * *